(12) United States Patent
Wei et al.

(10) Patent No.: US 11,971,446 B2
(45) Date of Patent: Apr. 30, 2024

(54) INTERFACE SYSTEM FOR INTERCONNECTED DIE AND MPU AND COMMUNICATION METHOD THEREOF

(71) Applicant: 58th Research Institute of China Electronics Technology Group Corporation, Jiangsu (CN)

(72) Inventors: Jinghe Wei, Jiangsu (CN); Letian Huang, Jiangsu (CN); Zhiqiang Xiao, Jiangsu (CN); Mingang Feng, Jiangsu (CN); Taojie Ding, Jiangsu (CN); Lihua Zheng, Jiangsu (CN)

( * ) Notice: Subject to any disclaimer, the term of this patent is extended or adjusted under 35 U.S.C. 154(b) by 156 days.

(21) Appl. No.: 17/626,824

(22) PCT Filed: Dec. 16, 2021

(86) PCT No.: PCT/CN2021/138700
§ 371 (c)(1),
(2) Date: Jan. 13, 2022

(87) PCT Pub. No.: WO2022/166425
PCT Pub. Date: Aug. 11, 2022

(65) Prior Publication Data
US 2022/0276304 A1 Sep. 1, 2022

(30) Foreign Application Priority Data
Feb. 5, 2021 (CN) .......................... 202110160514.3

(51) Int. Cl.
*G01R 31/317* (2006.01)
*G01R 31/3185* (2006.01)
*G06F 13/42* (2006.01)

(52) U.S. Cl.
CPC .................. *G01R 31/31705* (2013.01); *G01R 31/318547* (2013.01); *G01R 31/318555* (2013.01); *G01R 31/318597* (2013.01)

(58) Field of Classification Search
CPC ...................... G01R 31/31705; G06F 13/4282
See application file for complete search history.

(56) References Cited

U.S. PATENT DOCUMENTS

| | | | |
|---|---|---|---|
| 2004/0100900 A1* | 5/2004 | Lines .................. | G06F 13/4247 370/229 |
| 2021/0182141 A1* | 6/2021 | Balb ................... | G06F 11/3037 |
| 2021/0270894 A1* | 9/2021 | Spica ................. | G01R 31/3177 |

\* cited by examiner

*Primary Examiner* — David E Martinez

(57) ABSTRACT

The invention discloses an interface system for an interconnected die and an MPU and a communication method thereof. The system comprises a data interface, an interrupt interface, and a debugging interface; the data interface comprises an SPI interface, a DDR data interface, and a DMA control interface; the interrupt interface is used for receiving an interrupt data packet from the network and parsing the interrupt data packet to obtain a pulse interrupt input required by the MPU; the debugging interface comprises a JTAG-Core debugging interface, which is used for receiving a debugging data packet from the network and translating the debugging data packet into a JTAG protocol for MPU debugging. The invention realizes the expansion of the master device MPU in the high-performance information processing microsystem and the high-speed communication between the master device and the interconnected dies.

8 Claims, 13 Drawing Sheets

INTERFACE SYSTEM FOR INTERCONNECTED DIE AND MPU AND COMMUNICATION METHOD THEREOF

BACKGROUND OF THE INVENTION

1. Field of the Invention

The invention relates to a communication interface, in particular to an interface system for an interconnected die and an MPU and a communication method thereof.

2. Description of the Related Art

In a monolithic application specific integrated circuit, all components are designed and manufactured on a silicon chip with the same process. As the process size shrinks, the cost and development cycle of developing such integrated circuits have become extremely high. In this case, multi-die integration is an inevitable choice, that is, multiple chip components with different functions that have been verified and not packaged are interconnected and assembled, and packaged as a whole chip in the same package, so as to form a Network on Package (NoP). These dies can use different processes and come from different manufacturers, thus greatly shortening and reducing the development cycle and difficulty. The difficulty of multi-die lies in how to efficiently interconnect each die and ensure that high microsystem performance is achieved under power consumption constraints. The existing communication protocols for multi-die integration are either dedicated protocols, which are poor in versatility, or the technical system is too complex and difficult to use. In the case that the multi-die interconnected bus protocol is immature, how to define a multi-die interconnected bus protocol that meets China's current integrated circuit development needs based on China's actual conditions and current technical level is a key issue for breaking through the new generation of integrated microsystems.

The microsystem supports heterogeneous integration by reusing existing dies. From the perspective of system level division, a microsystem is formed by cascading multiple micro components, which are composed of interconnected dies and other dies. The interconnected die is based on the NoD (Network on Die, a die containing high-speed on-chip network and expansion bus), plus various standard protocol interface conversion, configuration units, clock management and other circuits to form a practical die. The interconnected die supporting integrated dies comprise MPU (embedded microprocessor die) as the master device, peripherals as the slave device, storage devices such as DDR SDRAM, and DSP and FPGA that can integrate multiple interface forms such as master device interface, slave device interface, and peer device interface. Since there are multiple interfaces, how to realize the expansion and communication between the interconnected die and the MPU is an urgent problem to be solved.

SUMMARY OF THE INVENTION

In order to solve the above problems, the invention provides an interface system for an interconnected die and an MPU, comprising an interrupt interface, a DDR data interface, an SPI interface and a JTAG-Core debugging interface, which can realize the expansion of the master device MPU in the high-performance information processing microsystem and the high-speed communication between the master device and the interconnected die by correspondingly interconnecting the interface provided by the interconnected die with the MPU interface, solve the problem of high-speed communication between interconnected dies and MPU, and efficiently expand and integrate processing devices of the master device such as MPU.

The specific technical solutions are:

an interface system for an interconnected die and an MPU, comprising a data interface, an interrupt interface, and a debugging interface; the data interface comprises an SPI interface, a DDR data interface, and a DMA control interface; the SPI interface is used for autonomous startup of the MPU during the startup phase, and the DMA control interface is used for DMA startup and end control; the interrupt interface is used for receiving an interrupt data packet from the network and parsing the interrupt data packet to obtain a pulse interrupt input required by the MPU, and meanwhile, the interrupt interface receives an interrupt address operation from the data interface and converts the interrupt address operation into an interrupt event to be sent out; the debugging interface comprises a JTAG-Core debugging interface, which is used for receiving a debugging data packet from the network and translating the debugging data packet into a JTAG protocol for MPU debugging.

Preferably, the SPI interface, the DDR data interface, the DMA control interface, and the interrupt interface are connected to the same router in the interconnected die; the debugging interface is connected to another router in the interconnected die.

A communication method of an interconnected die and an MPU, wherein a data transmission is carried out between the interconnected die and the MPU through the data interface, an interrupt transmission is carried out through the interrupt interface, and an MPU debugging is carried out through the debugging interface; the MPU controls data access between slave devices through the DMA control interface; the data interface comprises an SPI interface, a DDR data interface, and a DMA control interface; the debugging interface comprises a JTAG-Core debugging interface.

Preferably, the MPU sends a memory access request to the interconnected die in a DDR data format through the data interface; the interconnected die converts a response data packet into a DDR data format and sends it to the MPU.

Further, a request data packet is generated when the MPU sends a request event to the interconnected die, and generating the request data packet comprises the following steps: using the configurable address mapping table to convert the address information of the request event from the MPU into routing information, which is used to indicate the path that the data packet will pass through the network; generating the head and tail of the data packet in a packaging module, and generating body microchips of the event content to form a complete data packet; writing the data packet into a request buffer, and recording the current data packet information in the message queue; the interconnected die generates the response data packet into response information, and generating the response information comprises the following steps: reading the data packet from the response buffer, and deleting the corresponding data packet record from the message queue at the same time; an unpacking module verifies and deletes the head and tail of the data packet, and integrates the content in the body microchip of the data packet to generate detailed signals required by the master device.

Preferably, it further comprises using a watchdog to count each record stored in the message queue, from record generation to record deletion; if the retention time of a data packet in the message record exceeds a certain threshold, the watchdog count overflows and generates an interrupt to inform the MPU that the data packet is lost in the network and the data transmission fails, and the MPU will handle it accordingly.

Preferably, the interrupt transmission comprises an interrupt transmission between the MPU (master) and the MPU (master) and an interrupt transmission between the MPU (master) and the slave device; the interrupt transmission between the MPU and another MPU comprises the following steps: the MPU writes interrupt information to a fixed interrupt address preset in the address space of the MPU through the data interface, and the interrupt interface packs the interrupt information into an interrupt event data packet and sends it to the interconnected die; another MPU receives the interrupt event data packet through the interrupt interface and unpacks, and translates it into an interrupt signal; when the interrupt is transferred from the master device to the slave device, the interrupt interface of the slave device collects the interrupt information from the slave device and encodes and packs it into an interrupt event data packet and sends it to the interconnected die; the interrupt interface of the MPU receives the interrupt event data packet and unpacks, and translates it into an interrupt signal.

Preferably, when the MPU controls the data access between the slave devices through the DMA control interface, by accessing a preset fixed DMA address in the address space of the MPU, it converts the access address space into the DMA register configuration and starts the DMA to complete the corresponding data movement instructions.

Further, the MPU controlling the data access between the slave devices through the DMA control interface comprises the following steps: step 1: the MPU writes the configuration information of address information and data length of the data transmission into the exclusive address space of the DMA through the data interface; step 2: after receiving the configuration information, the DMA control interface sends a read request event to the source slave device, and there is a specific event information flag in the read request event; the data returned from the slave device is returned to the destination slave device; step 3: after receiving the read request event, the source slave device packs the data that needs to be read into a write data event and sends it to the destination slave device; step 4: after receives the write data event, the destination slave device returns a write response event to the DMA control interface; step 5: after receiving the write response event, the DMA control interface generates an interrupt pulse to inform the MPU that the data transmission is complete.

Compared with the prior art, the invention has the following advantageous effects:

The interface system for an interconnected die and an MPU of the invention connects the interface provided by the interconnected die with the MPU interface of the master device through the interrupt interface, the DDR data interface, the SPI interface, and the JTAG-Core debugging interface, which realizes the expansion of the master device MPU in the high-performance information processing microsystem and the high-speed communication between the master device and the interconnected die.

1. The interface system for an interconnected die and an MPU can meet the integration and expansion of die of master device such as MPU. The interconnected die provides a master device interrupt interface, a DDR data interface, an SPI interface, and a JTAG-Core debugging interface for the MPU master device. The expansion of the master device MPU in the high-performance information processing microsystem can be realized by correspondingly interconnecting the interface provided by the interconnected die with the master device MPU interface.

2. The SPI interface in the master device interface is only used to start BootRom to read and will not occupy bandwidth during operation; the DMA interface does not directly participate in data transmission, so the amount of data is small; the data volume of the interrupt interface is small and the occupied bandwidth is small; therefore, connecting the three data interfaces and the interrupt interface to a router after arbitrating and distributing them through their respective converters can effectively reduce the complexity of address mapping while ensuring the overall performance of the master device interface.

DETAILED DESCRIPTION OF THE PREFERRED EMBODIMENTS

The invention will now be further described with reference to the drawings.

Figure 15:
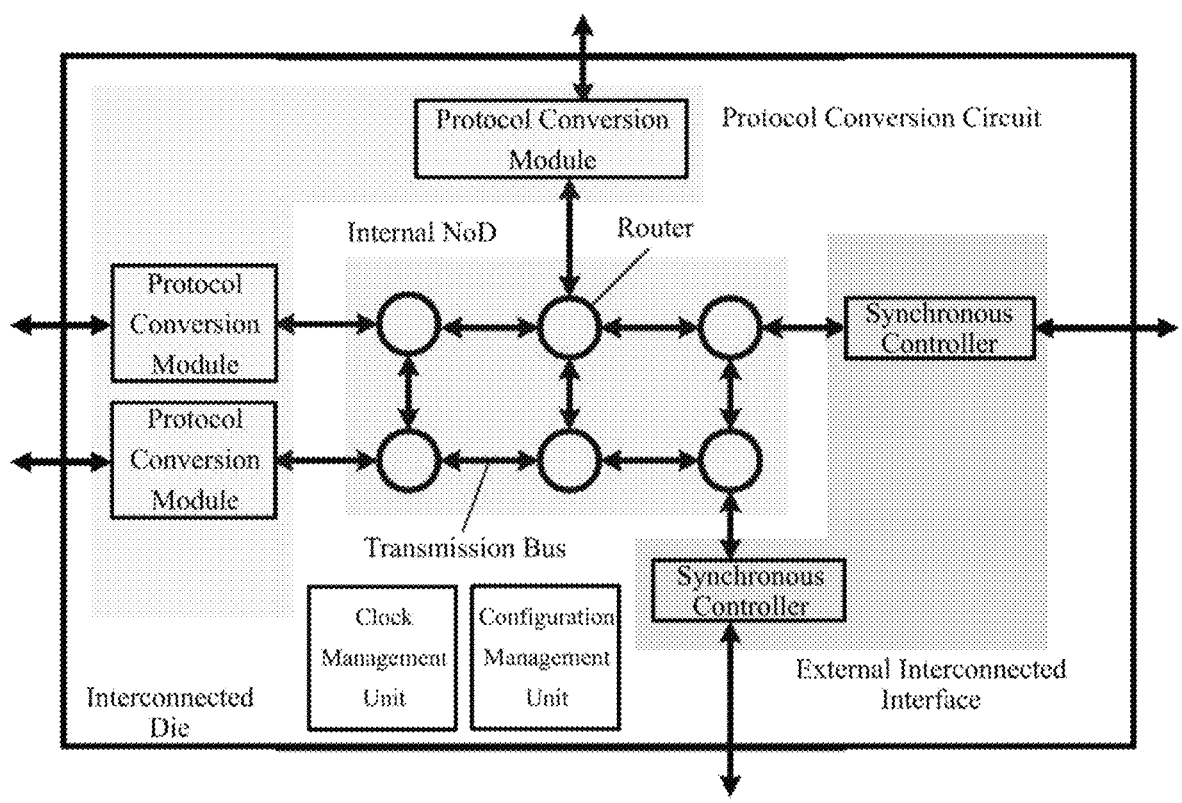
FIG. 15 is a schematic diagram of the structure of the interconnected die.

As shown in FIG. 15, an interconnected die, comprising: a protocol conversion circuit, wherein the protocol conversion circuit comprises multiple protocol conversion modules, which are used to provide a variety of standard mainstream protocol interfaces for connecting with the outside; an external interconnected interface, wherein the external interconnected interface comprises a pair of synchronization controllers for communication with other interconnected dies; and an internal NoD, wherein the internal NoD comprises a transmission bus and a router; the synchronization controller and the protocol conversion module are respectively connected to the boundary nodes of the internal NoD to transmit data packets from interfaces or other interconnected dies.

The functional die is connected to the protocol conversion module through a standard protocol bus.

The interconnected dies are connected by the external interconnected interface.

The interconnecting die is mainly composed of three parts: an internal NoD (Network on Die), a protocol conversion circuit, and an external interconnected interface. The NoD is used for data routing and high-speed transmission. The protocol conversion circuit provides a variety of standard mainstream protocol interfaces for connecting with the outside, and the protocol conversion circuit comprises a plurality of protocol conversion modules that convert the NoD protocol to the mainstream protocol for connecting with other functional dies. The external interconnected interface is mainly composed of a pair of synchronization controllers, and the external interconnected interface is controlled by the synchronization controller to realize data transmission in different clock domains inside and outside the die. Each conversion module of the external interconnected interface and the protocol conversion circuit is respectively connected to a boundary node in the NoD, thereby forming a data transmission path.

The interconnected die transmits the interrupt request in the form of a data packet on the network.

Embodiment 1

Figure 1:
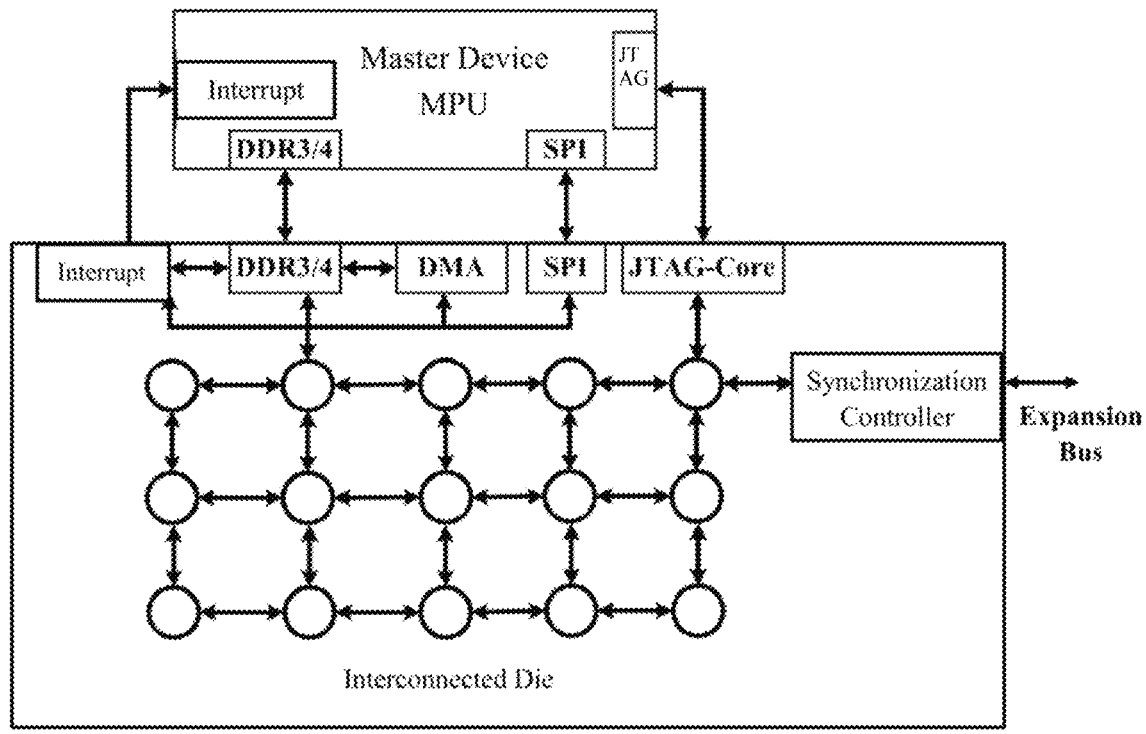
FIG. 1 is a schematic diagram of the structure of the interface system for an interconnected die and an MPU.
Figure 2:
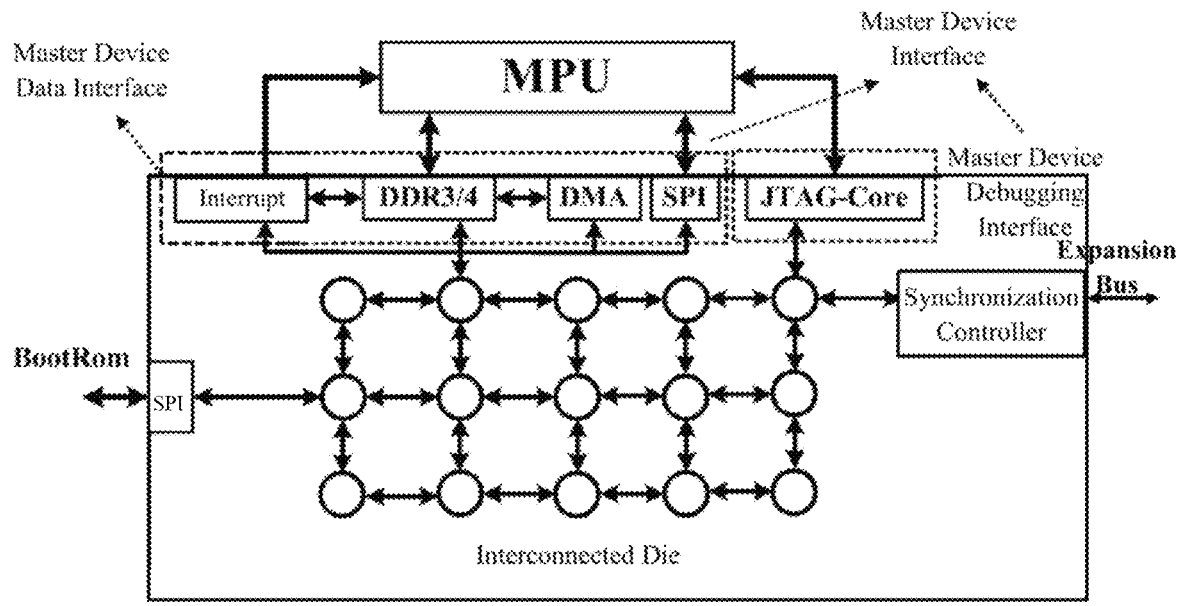
FIG. 2 is a schematic diagram of the complete structure of the interface system for an interconnected die and an MPU.

As shown in FIG. 1 and FIG. 2, an interface system for an interconnected die and an MPU, comprising a data interface, an interrupt interface, and a debugging interface; the data interface comprises an SPI interface, a DDR data interface, and a DMA control interface; the SPI interface is used for autonomous startup of the MPU during the startup phase, and the DMA control interface is used for DMA startup and end control; the interrupt interface is used for receiving an interrupt data packet from the network and parsing the interrupt data packet to obtain a pulse interrupt input required by the MPU, and meanwhile, the interrupt interface receives an interrupt address operation from the data interface and converts the interrupt address operation into an interrupt event to be sent out; the debugging interface comprises a JTAG-Core debugging interface, which is used for receiving a debugging data packet from the network and translating the debugging data packet into a JTAG protocol for MPU debugging.

The SPI interface, the DDR data interface, the DMA control interface, and the interrupt interface are connected to the same router in the interconnected die; the debugging interface is connected to another router in the interconnected die.

The high-performance information processing microsystem with multi-die integration can meet the integration and expansion of die of master device such as MPU. The interconnected die provides a master device interrupt interface, a DDR data interface, a SPI interface, and a JTAG-Core debugging interface for the MPU master device, as shown in FIG. 1. The expansion of the master device MPU in the high-performance information processing microsystem can be realized by correspondingly interconnecting the interface provided by the interconnected die with the master device MPU interface.

Since the NoD in the interconnected die can convert all memory access operations into corresponding data packets and transmit them through the inside-die and inter-die network, therefore, for the memory access request of the master device, it is only necessary for the master device to send a memory access request in the DDR data format to the interconnected die through the DDR data interface. The DDR data interface of the master device that interconnects the dies packs it and sends the data packet to the network. At the same time, the DDR data interface of the master device can also receive the data response from the interconnected die, that is, the DDR data interface of the master device of the interconnected die converts the response data packet into a DDR data format and inputs it to the master device.

For the interrupt request of the master device, there is a fixed space in the address space of the master device as the interrupt address. The master device can complete the sending of the interrupt request by writing interrupt information to its own interrupt address through the DDR data interface. After receiving the interrupt information, the interrupt interface of the master device that interconnects the dies packs the interrupt request into an interrupt event (the event defined to handle data transmission; in addition, the data event is also defined, comprising the read request event and the read response event, as well as the write data event and the write response event) data packet and sends it to the network. For the interrupt reception of the master device, the master device interrupt interface of the interconnected dies unpacks the interrupt event data packet according to the specified data packet format and translates it into an interrupt signal. The master device receives the interrupt information from the interconnected die through the interrupt interface, and then interrupts the MPU.

The master device can control data access between two or more slave devices through the DMA control interface. Similar to interrupts, there is a fixed space in the address space of the master device as the DMA address. Therefore, the master device configures and starts the DMA control interface in the interconnected die master device interface through the DDR data interface, and data transmission can be carried out between two or more slave devices under the control of the DMA control interface.

The SPI interface of the master device is used for the autonomous startup of the master device during the startup phase. The MPU sends a read request to the BootRom on the interconnected die through the SPI interface to read the startup code of the MPU, and executes the startup code to realize the startup of the MPU.

The JTAG interface of the master device is used to connect the JTAG-Core interface in the interface of the interconnected die master device. The MPU receives the JTAG debugging commands from the interconnected die through this interface to realize the debugging of the master device in the high-performance information processing microsystem Specifically, as shown in FIG. 2, a complete MPU interface is divided into three types: data interface, interrupt interface, and debug interface. The interconnected die provides a master device interrupt interface, a DDR data interface, an SPI interface and a JTAG-Core debugging interface for the MPU master device, wherein the data interface comprises an MPU's BootROM exclusive SPI interface, a DDR data interface, and a DMA control interface; the interrupt interface is used for receiving an interrupt data packet from the network and parsing the interrupt data packet to obtain a pulse interrupt input required by the MPU, and meanwhile, the interrupt interface receives an interrupt address operation from the DDR and converts the interrupt address operation into an interrupt event to be sent out; the debugging interface JTAG-CORE belongs to the slave interface type, which is used for receiving a debugging data packet from the network and translating the debugging data packet into a JTAG protocol for MPU debugging.

The three data interfaces and interrupt interfaces are connected to a router after arbitration and distribution through their respective converters: this is because the SPI interface of these four interfaces is only used to start BootRom reading and will not occupy bandwidth during operation; the difference between the DMA control interface and the traditional DMA is that the DMA control interface here is only used for DMA start and end control, and does not directly participate in data transmission, so the amount of data is small; the data volume of the interrupt interface is small and the bandwidth is small; therefore, these four interfaces are connected to the same router, which effectively reduces the complexity of address mapping while ensuring the overall performance of the master device interface. When the four interfaces have data packets sent at the same time, they will be sent out in sequence after arbitration by the arbitration circuit. When the incoming data packets arrive at this interface router interface, the distribution circuit will distribute them to each interface according to the event type and event address in the data packet: if it is an interrupt event, it will be distributed to the interrupt interface for conversion; if it is BootRom data, it will be distributed to the SPI interface for conversion; if it is a data type, it will be sent to the data interface or the DMA control interface. In addition, the debugging interface of the MPU is independent of other interfaces, which is used as a conventional slave data interface to receive debugging instructions from the network. Here, debugging is regarded as reading and writing to the internal registers of the MPU.

Embodiment 2

A communication method of an interconnected die and an MPU, wherein a data transmission is carried out between the interconnected die and the MPU through the data interface, an interrupt transmission is carried out through the interrupt interface, and an MPU debugging is carried out through the debugging interface; the MPU controls data access between slave devices through the DMA control interface; the data interface comprises an SPI interface, a DDR data interface, and a DMA control interface; the debugging interface comprises a JTAG-Core debugging interface.

The MPU sends a memory access request to the interconnected die in a DDR data format through the data interface; the interconnected die converts a response data packet into a DDR data format and sends it to the MPU.

A request data packet is generated when the MPU sends a request event to the interconnected die, and generating the request data packet comprises the following steps: using the configurable address mapping table to convert the address information of the request event from the MPU into routing information, which is used to indicate the path that the data packet will pass through the network; generating the head and tail of the data packet in a packaging module, and generating body microchips of the event content to form a complete data packet; writing the data packet into a request buffer, and recording the current data packet information in the message queue; the interconnected die generates the response data packet into response information, and generating the response information comprises the following steps: reading the data packet from the response buffer, and deleting the corresponding data packet record from the message queue at the same time; an unpacking module verifies and deletes the head and tail of the data packet, and integrates the content in the body microchip of the data packet to generate detailed signals required by the master device.

It further comprises using a watchdog to count each record stored in the message queue, from record generation to record deletion; if the retention time of a data packet in the message record exceeds a certain threshold, the watchdog count overflows and generates an interrupt to inform the MPU that the data packet is lost in the network and the data transmission fails, and the MPU will handle it accordingly.

The interrupt transmission comprises an interrupt transmission between the MPU (master) and the MPU (master) and an interrupt transmission between the MPU (master) and the slave device; the interrupt transmission between the MPU and another MPU comprises the following steps: the MPU writes interrupt information to a fixed interrupt address preset in the address space of the MPU through the data interface, and the interrupt interface packs the interrupt information into an interrupt event data packet and sends it to the interconnected die; another MPU receives the interrupt event data packet through the interrupt interface and unpacks, and translates it into an interrupt signal; when the interrupt is transferred from the master device to the slave device, the interrupt interface of the slave device collects the interrupt information from the slave device and encodes and packs it into an interrupt event data packet and sends it to the interconnected die; the interrupt interface of the MPU receives the interrupt event data packet and unpacks, and translates it into an interrupt signal.

When the MPU controls the data access between the slave devices through the DMA control interface, by accessing a preset fixed DMA address in the address space of the MPU, it converts the access address space into the DMA register configuration and starts the DMA to complete the corresponding data movement instructions.

The MPU controlling the data access between the slave devices through the DMA control interface comprises the following steps: step 1: the MPU writes the configuration information of address information and data length of the data transmission into the exclusive address space of the DMA through the data interface; step 2: after receiving the configuration information, the DMA control interface sends a read request event to the source slave device, and there is a specific event information flag in the read request event; the data returned from the slave device is returned to the destination slave device; step 3: after receiving the read request event, the source slave device packs the data that needs to be read into a write data event and sends it to the destination slave device; step 4: after receives the write data event, the destination slave device returns a write response event to the DMA control interface; step 5: after receiving the write response event, the DMA control interface generates an interrupt pulse to inform the MPU that the data transmission is complete.

Figure 3:
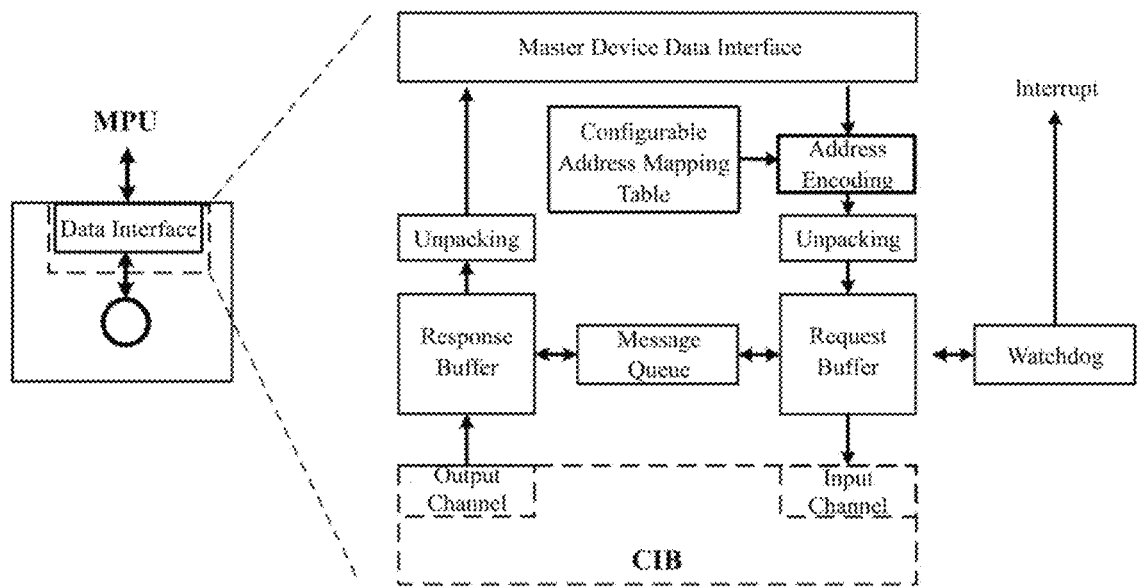
FIG. 3 is a schematic diagram of the structure of the data interface of the MPU.

The conversion method of the master device data interface is as follows:

As shown in FIG. 3, SPI and DDR (DMA) are both used as data type interfaces and have the same hardware implementation.

For the input channel, it is mainly responsible for processing request events from the master device, and is used to generate request packets: firstly using the configurable address mapping table to convert the address information of the request event from the MPU into routing information, which is used to indicate the path that the data packet will pass through the network; then generating the head and tail of the data packet in a packaging module, and generating body microchips of the event content to form a complete data packet; lastly writing the data packet into a request buffer, and recording the current data packet information in the message queue.

For the output channel, it is mainly responsible for processing the response data packet from the on-chip network, and is used to generate the response information required by the master device: firstly reading the data packet from the response buffer, and deleting the corresponding data packet record from the message queue at the same time; then an unpacking module verifies and deletes the head and tail of the data packet, and integrates the content in the body microchip of the data packet to generate detailed signals required by the master device.

In addition, in order to avoid the master device's constant waiting due to event dependence (one event must be strictly completed before the next event), the master device protocol conversion interface is further provided with a watchdog module; the watchdog module is a set of counters, which generates a pulse when the count value is full. The watchdog will count each record stored in the message queue, from record generation to record deletion; if the retention time of a data packet in the message record exceeds a certain threshold, the watchdog count overflows and generates an interrupt to inform the MPU that the data packet is lost in the network and the data transmission fails, and the master device will handle it accordingly.

The conversion method of the master device interrupt interface is as follows:

The interrupt interface not only realizes the response to the interrupt event, but also realizes the issue of the interrupt event. There is a fixed space in the address space of the master device as the interrupt address. After the master device writes interrupt information to the interrupt address through the data interface (DDR), the interrupt controller packs this information into an interrupt event data packet and sends it out.

Figure 4:
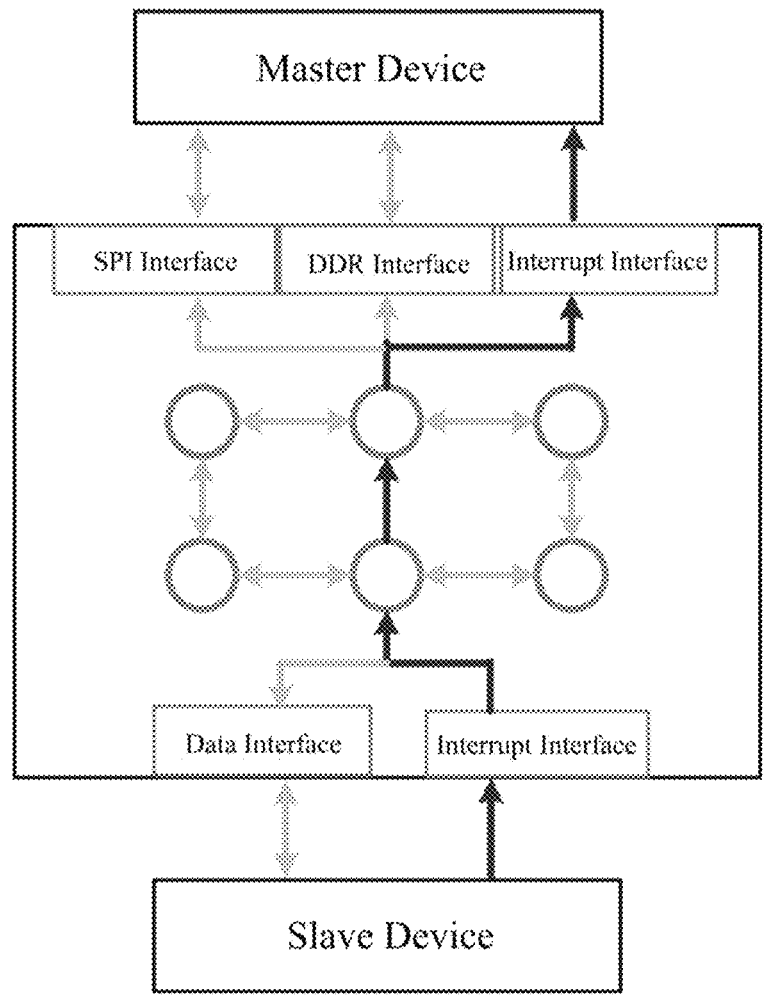
FIG. 4 is a schematic diagram of the interrupt transmission between the MPU and the slave device.

In NoD, the slave-master interrupt transmission is shown in FIG. 4. The interrupt receiving interface at the slave device interface collects the pulse interrupt information from the slave device and encodes it into an interrupt event data packet. After this data packet reaches the interrupt interface of the master device after being transmitted through the network, it is unpacked and sent to the master device as a corresponding interrupt pulse.

Figure 5:
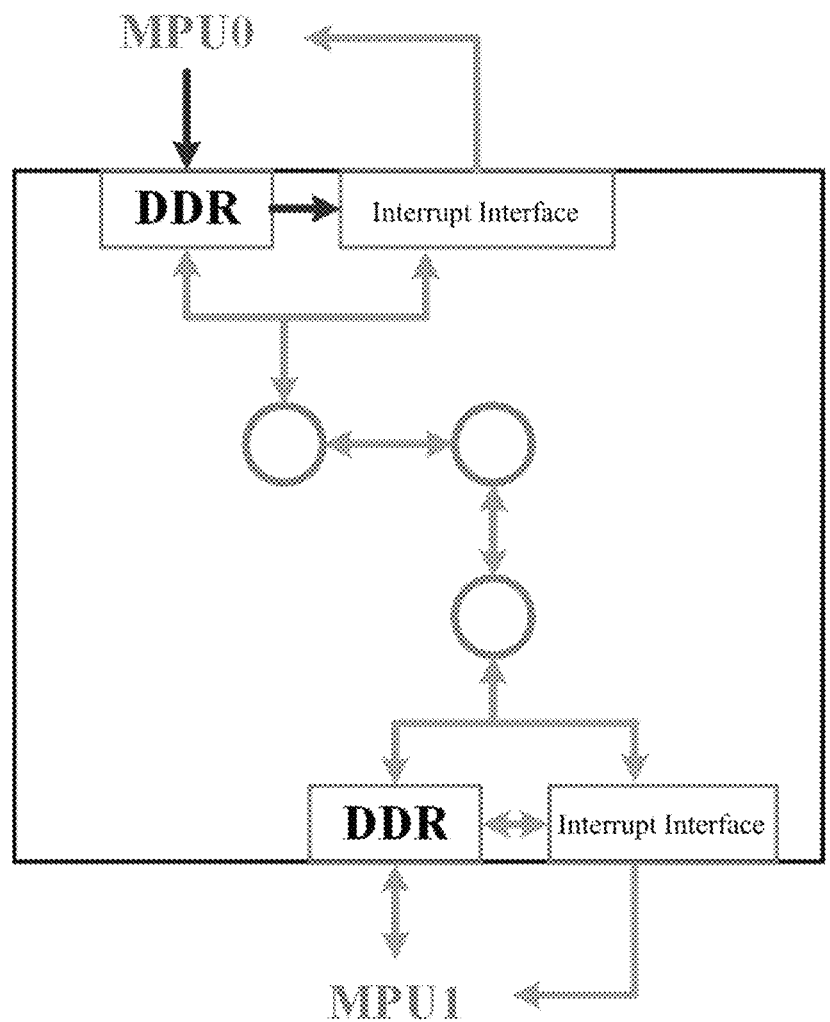
FIG. 5 is a schematic diagram of MPU0 writing interrupt data to the interrupt address.
Figure 6:
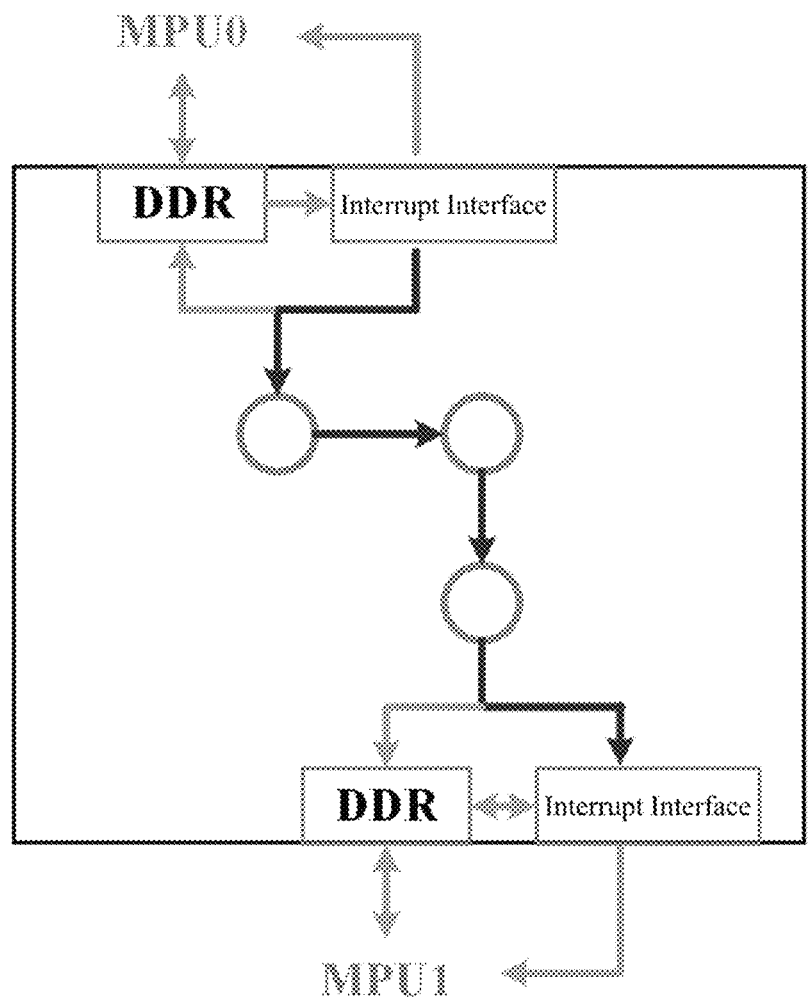
FIG. 6 is a schematic diagram of the interrupt interface of MPU0 packing and sending the interrupt event data packet to MPU1.
Figure 7:
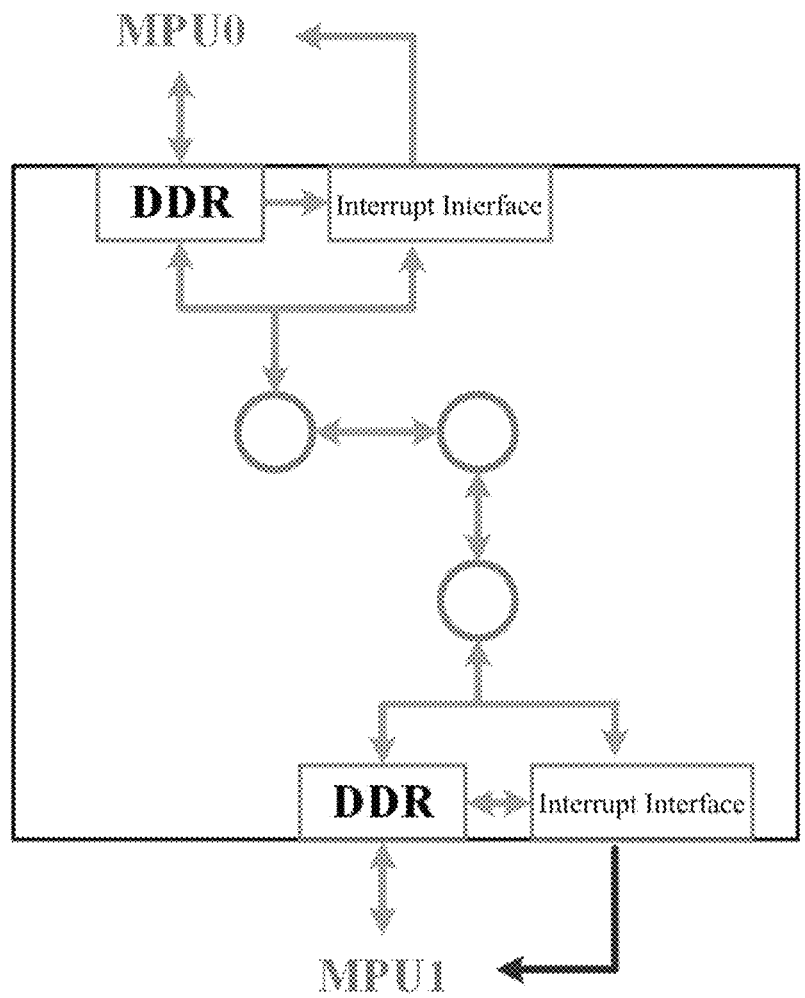
FIG. 7 is the interrupt interface of MPU1 parses the data packet and generates the corresponding interrupt pulse.

In NoD, the interrupt transmission between the MPU (master) and the MPU (master) is shown in FIG. 5 to FIG. 7, which is divided into 3 steps:
  step 1, as shown in FIG. 5, MPU0 writes interrupt information data to its own interrupt address;
  step 2, as shown in FIG. 6, the interrupt interface generates an interrupt data packet based on the interrupt information and sends it to the destination master device MPU1;
  step 3, as shown in FIG. 7, after receiving the interrupt data packet, the interrupt interface of MPU1 parses and generates an interrupt pulse to MPU1.

Figure 8:
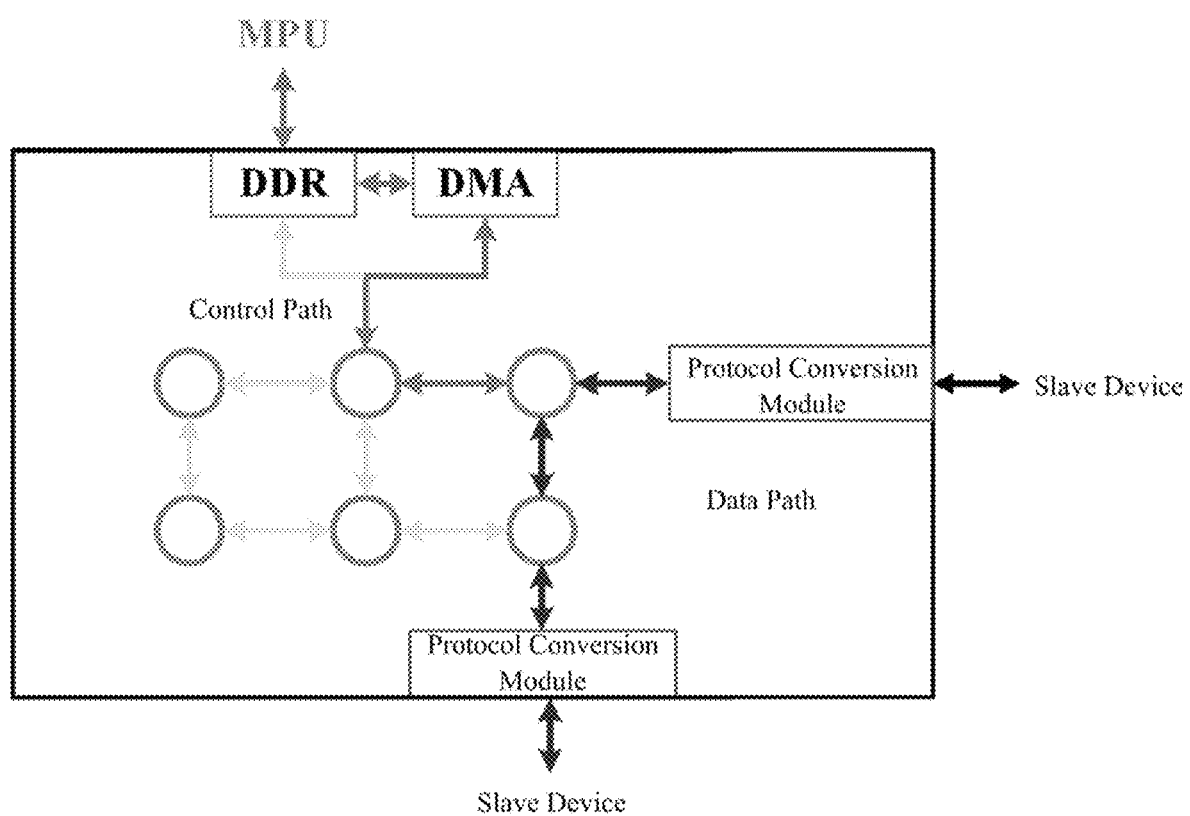
FIG. 8 is a schematic diagram of DMA controlling data transmission from a slave device to a slave device.

The conversion method of the master device DMA control interface is as follows:

The existing basic data event types cannot realize the data transmission between the slave device and the slave device in the network, because the slave device interface cannot actively send request events and can only passively receive request events. Then, if you want to realize the slave-slave data transmission, an additional hardware is needed to issue the corresponding request event, and the DMA control interface is responsible for completing this work, as shown in FIG. 8.

Figure 9:
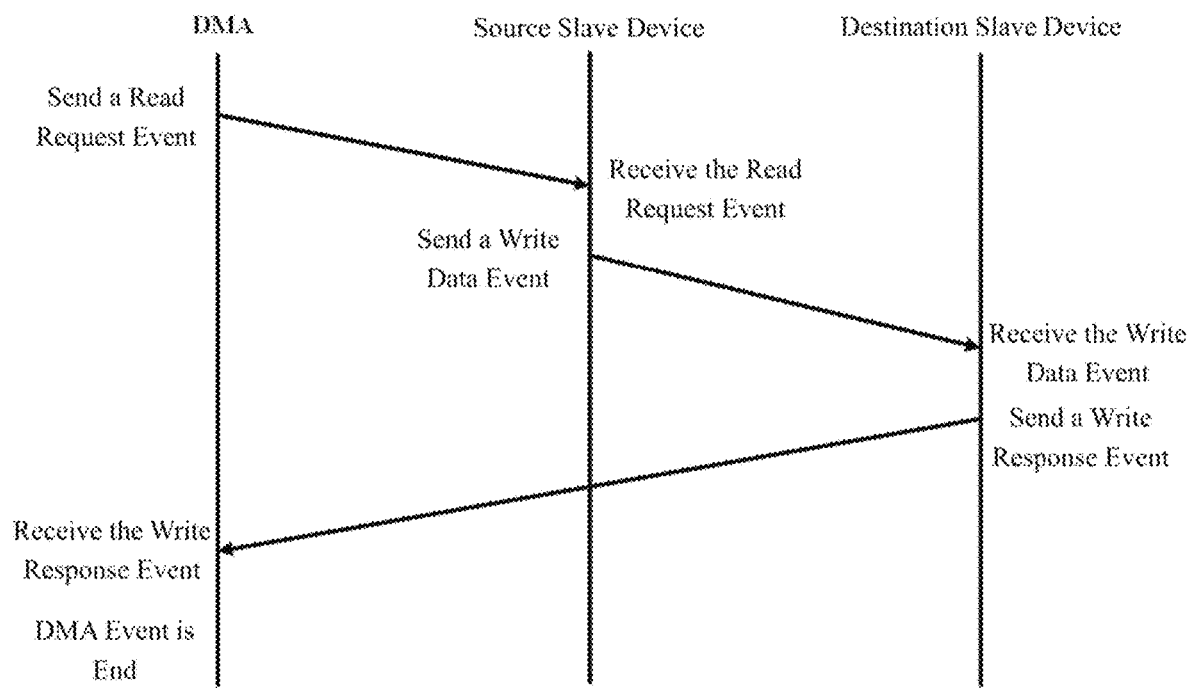
FIG. 9 is a flow chart of DMA controlling data transmission from a slave device to a slave device.
Figure 10:
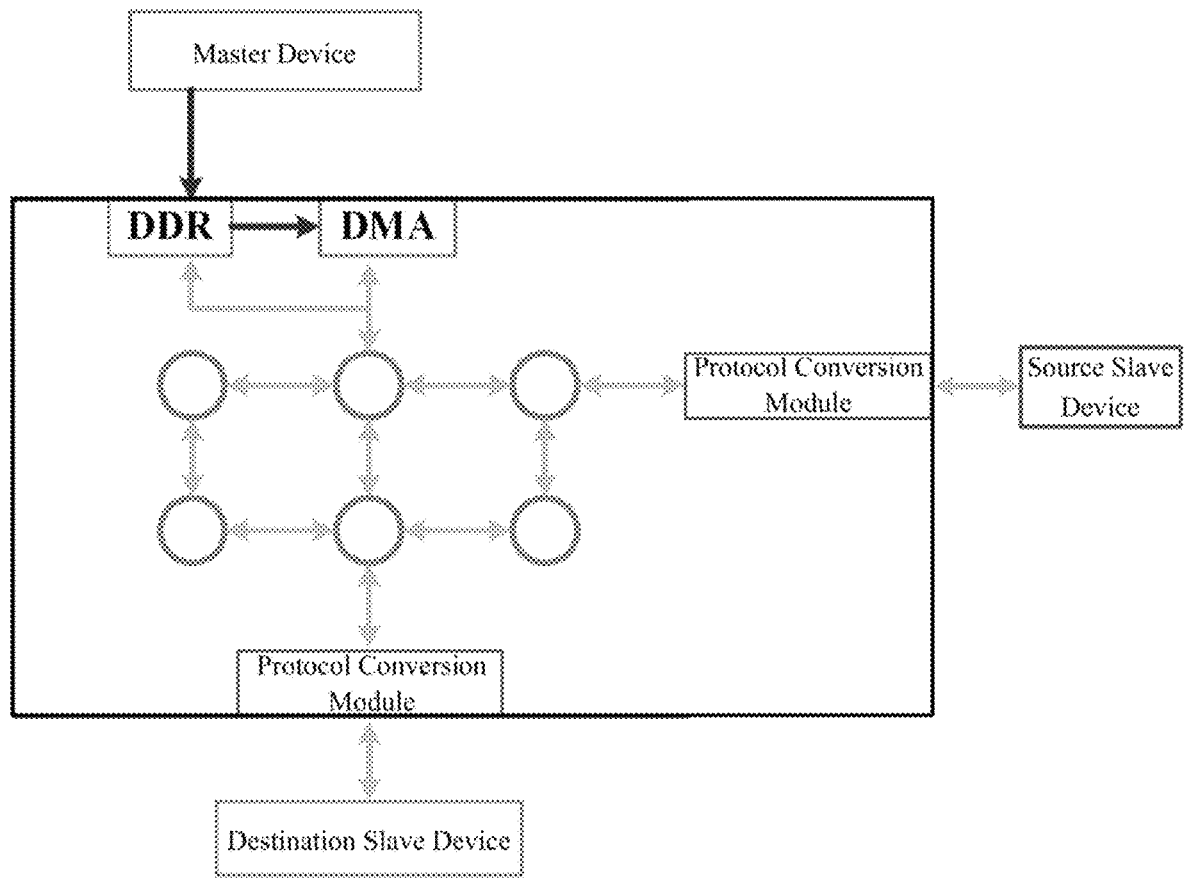
FIG. 10 is a schematic diagram of the MPU sending control instructions to the DMA address space.
Figure 11:
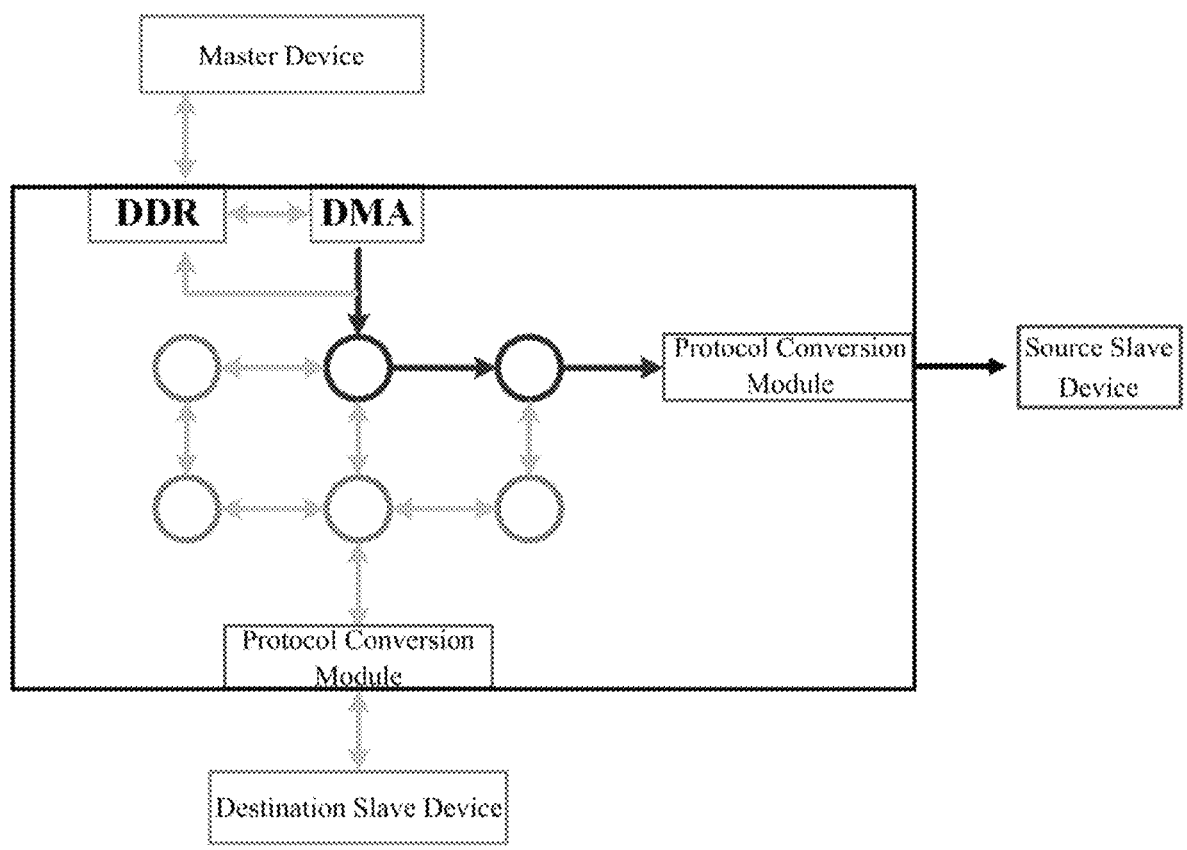
FIG. 11 is a schematic diagram of DMA sending a read request event to the source slave device.
Figure 12:
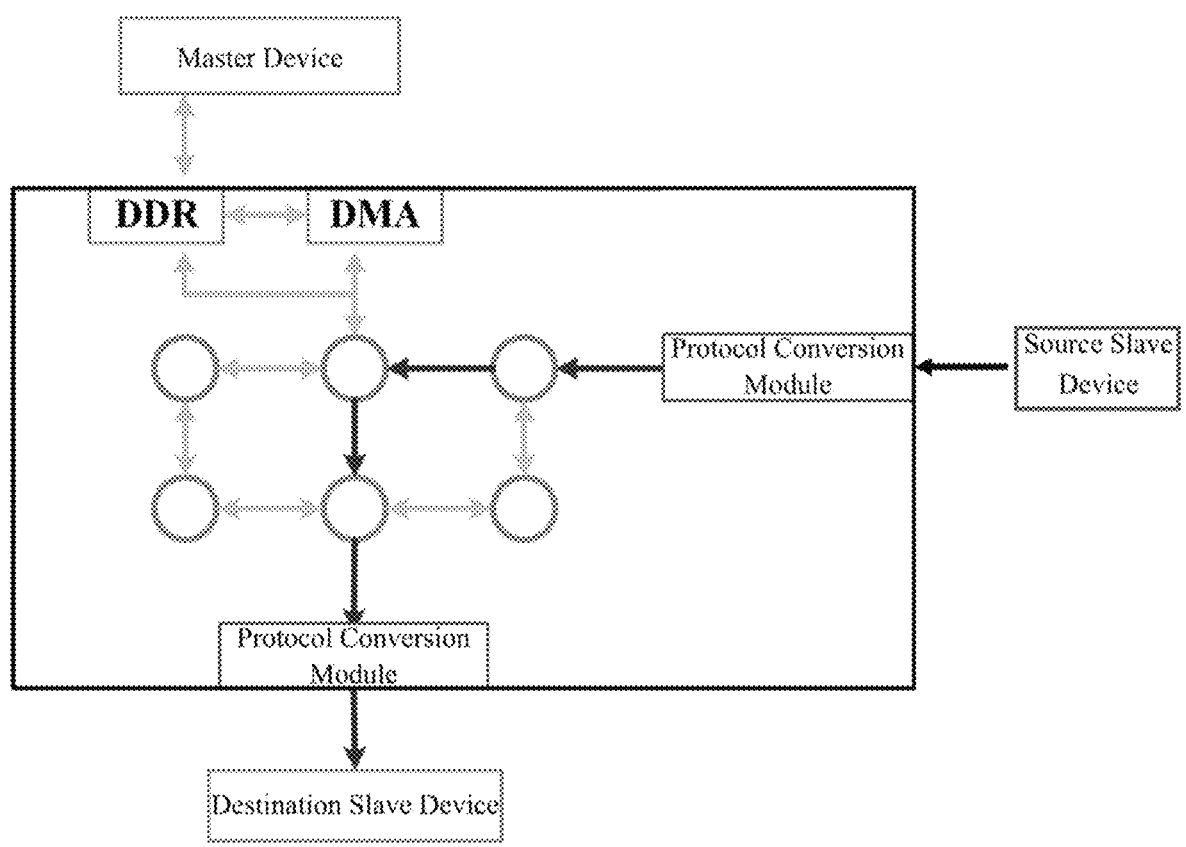
FIG. 12 is a schematic diagram of the source slave device sending a data write event to the destination slave device.
Figure 13:
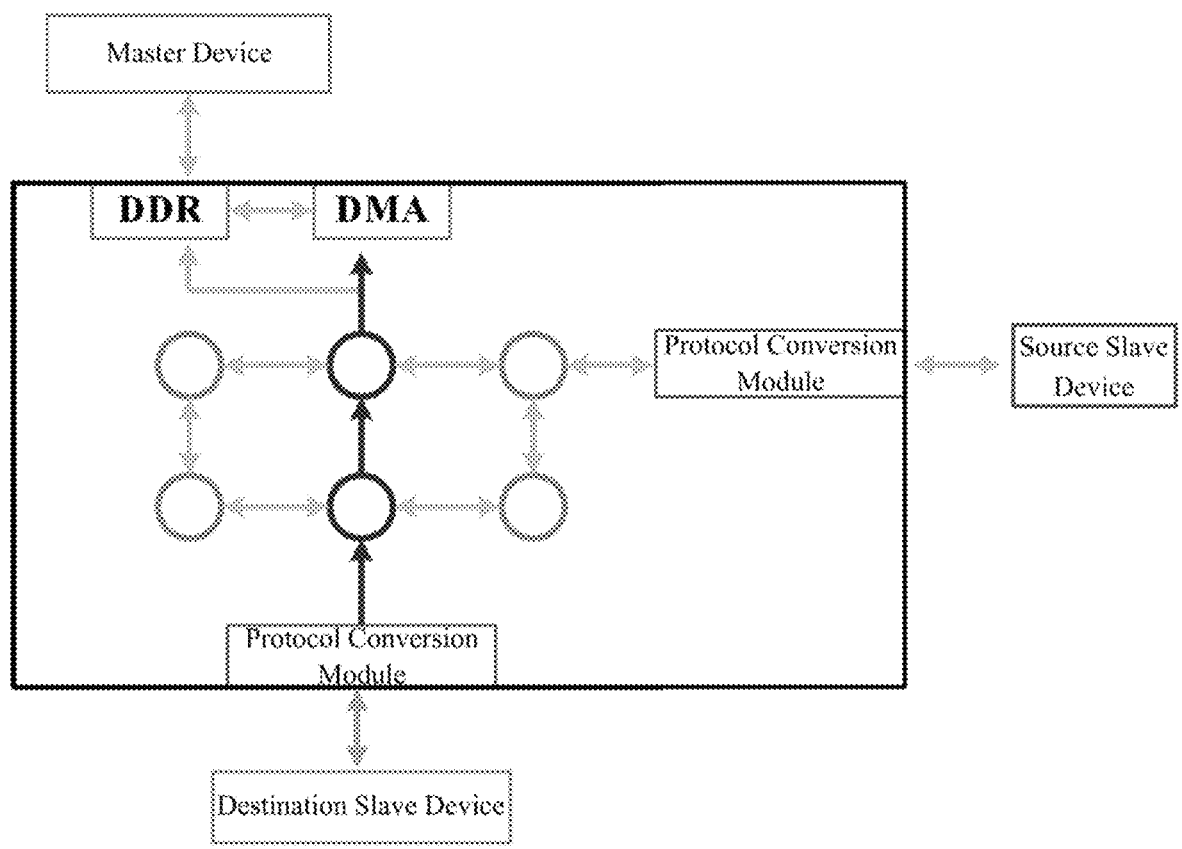
FIG. 13 is a schematic diagram of the destination slave device sending a write response event to DMA.
Figure 14:
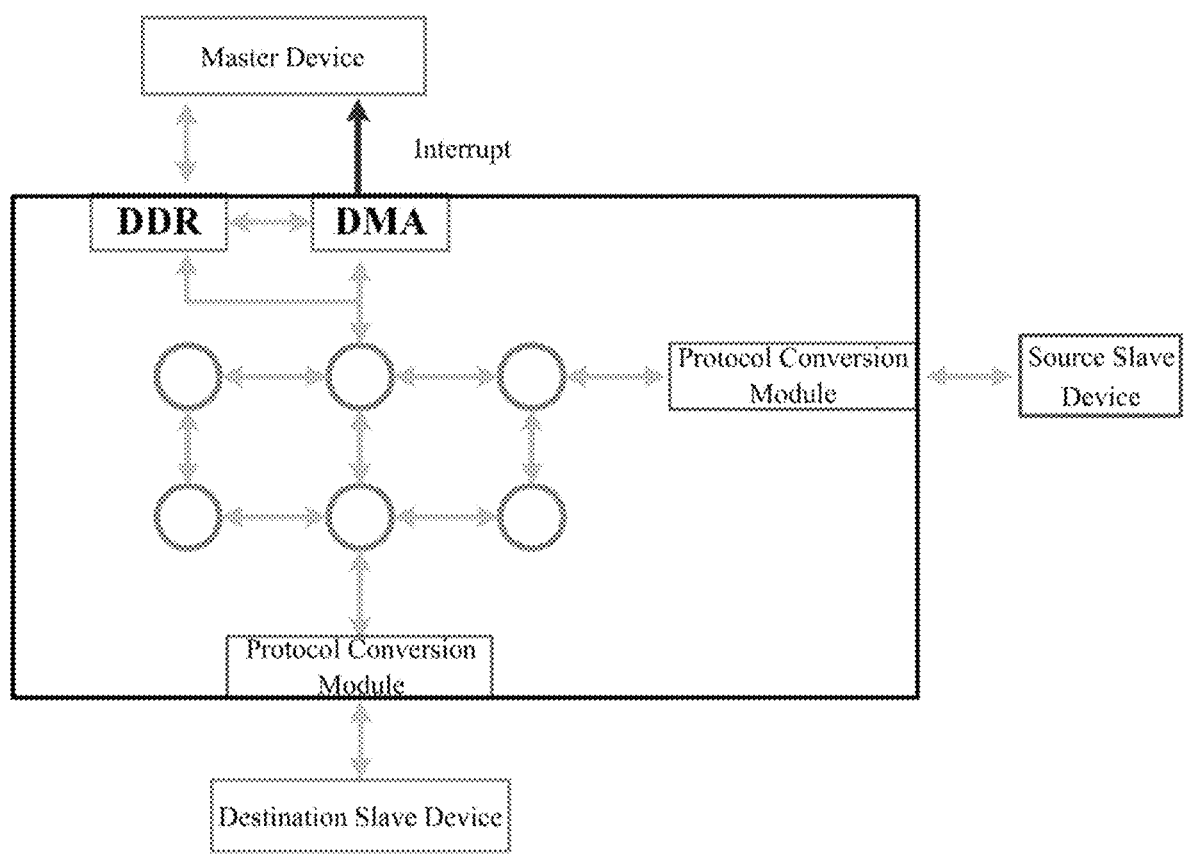
FIG. 14 is a schematic diagram of DMA sending an interrupt to MPU.

Similar to the interrupt interface, there will be a fixed address space in the MPU address space allocated to the DMA control interface, and access to this address space will be converted to configure the registers of the DMA control interface and start the DMA to complete the corresponding data transmission instructions; therefore, the DMA control interface is used as a DDR derivative interface. When the data read and write address in the DDR falls in the DMA address space, the data read and write will not be sent to the network through the DDR data interface, but the DMA control interface will analyze and perform data transmission. As shown in FIG. 9, it is a slave-slave data transmission process initiated by the MPU.
  step 1, as shown in FIG. 10, the MPU writes the configuration information such as address information and data length of the data transmission into the exclusive address space of the DMA through the data interface;
  step 2, as shown in FIG. 11, after receiving the configuration information, the DMA control interface sends a read request event to the source slave device, and there is a specific event information flag in the read request event that the data returned by the slave device is not returned to the MPU, but to the specific destination slave device;
  step 3, as shown in FIG. 12, after receiving the read request event, the source slave device packs the data that needs to be read into a write data event and sends it to the destination slave device;
  step 4, as shown in FIG. 13, after receives the write data event, the destination slave device returns a write response event to the DMA control interface;
  step 5, as shown in FIG. 14, after receiving the write response event, the DMA control interface generates an interrupt pulse to inform the MPU that the data transmission is complete.

The advantages of using the above method are:
1. the high-performance information processing microsystem with multi-die integration can meet the integration and expansion of die of master device such as MPU. The interconnected die provides a master device interrupt interface, a DDR data interface, an SPI interface, and a JTAG-Core debugging interface for the MPU master device. The expansion of the master device MPU in the high-performance information processing microsystem can be realized by correspondingly interconnecting the interface provided by the interconnected die with the master device MPU interface.
2. The SPI interface in the master device interface is only used to start BootRom to read and will not occupy bandwidth during operation; the DMA interface does not directly participate in data transmission, so the amount of data is small; the data volume of the interrupt interface is small and the occupied bandwidth is small; therefore, connecting the three data interfaces and the interrupt interface to a router after arbitrating and distributing them through their respective converters can effectively reduce the complexity of address mapping while ensuring the overall performance of the master device interface.

The technical principle of the invention has been described hereinabove with reference to specific embodiments. These descriptions are only for explaining the principle of the invention, and cannot be construed as limiting the protection scope of the invention in any way. Based on the explanation here, those skilled in the art can think of other specific implementation manners of the invention without creative efforts, and these manners shall all fall within the protection scope of the claims of the invention.

The invention claimed is:

1. An interface system for an interconnected die and an MPU, comprising a data interface, an interrupt interface, and a debugging interface; the data interface comprises an SPI interface, a DDR data interface, and a DMA control interface; the SPI interface is used for autonomous startup of the MPU during the startup phase, and the DMA control interface is used for DMA startup and end control; the interrupt interface is used for receiving an interrupt data packet from the network and parsing the interrupt data packet to obtain a pulse interrupt input required by the MPU, and meanwhile, the interrupt interface receives an interrupt address operation from the data interface and converts the interrupt address operation into an interrupt event to be sent out; the debugging interface comprises a JTAG-Core debugging interface, which is used for receiving a debugging data packet from the network and translating the debugging data packet into a JTAG protocol for MPU debugging.

2. The interface system for an interconnected die and an MPU according to claim 1, wherein the SPI interface, the DDR data interface, the DMA control interface, and the interrupt interface are connected to the same router in the interconnected die; the debugging interface is connected to another router in the interconnected die.

3. A communication method of an interconnected die and an MPU, wherein a data transmission is carried out between the interconnected die and the MPU through a data interface, an interrupt transmission is carried out through an interrupt interface, and an MPU debugging is carried out through a debugging interface; the MPU controls data access between slave devices through a DMA control interface; the data interface comprises an SPI interface, a DDR data interface, and a DMA control interface; the debugging interface comprises a JTAG-Core debugging interface;

when the MPU controls the data access between the slave devices through the DMA control interface, by accessing a preset fixed DMA address in the address space of the MPU, it converts the access address space into the DMA register configuration and starts the DMA to complete the corresponding data movement instructions.

4. The communication method of an interconnected die and an MPU according to claim 3, wherein the MPU sends a memory access request to the interconnected die in a DDR data format through the data interface; the interconnected die converts a response data packet into a DDR data format and sends it to the MPU.

5. The communication method of an interconnected die and an MPU according to claim 4, wherein a request data packet is generated when the MPU sends a request event to the interconnected die, and generating the request data packet comprises the following steps: using the configurable address mapping table to convert the address information of the request event from the MPU into routing information, which is used to indicate the path that the data packet will pass through the network; generating the head and tail of the data packet in a packaging module, and generating body microchips of the event content to form a complete data packet; writing the data packet into a request buffer, and recording the current data packet information in the message queue;

the interconnected die generates the response data packet into response information, and generating the response information comprises the following steps: reading the data packet from the response buffer, and deleting the corresponding data packet record from the message queue at the same time; an unpacking module verifies and deletes the head and tail of the data packet, and integrates the content in the body microchip of the data packet to generate detailed signals required by the master device.

6. The communication method of an interconnected die and an MPU according to claim 3, wherein it further comprises using a watchdog to count each record stored in the message queue, from record generation to record deletion; if the retention time of a data packet in the message record exceeds a certain threshold, the watchdog count overflows and generates an interrupt to inform the MPU that the data packet is lost in the network and the data transmission fails, and the MPU will handle it accordingly.

7. The communication method of an interconnected die and an MPU according to claim 3, wherein the interrupt transmission comprises an interrupt transmission between a first MPU (master) and a second MPU (master) and an interrupt transmission between the MPU (master) and the slave device;

the interrupt transmission between a first MPU and a second MPU comprises the following steps: the first MPU writes interrupt information to a fixed interrupt address preset in the address space of the first MPU through the data interface, and the interrupt interface packs the interrupt information into an interrupt event data packet and sends it to the interconnected die; the second MPU receives the interrupt event data packet through the interrupt interface and unpacks, and translates it into an interrupt signal;

when the interrupt is transferred from the master device to the slave device, the interrupt interface of the slave device collects the interrupt information from the slave device and encodes and packs it into an interrupt event data packet and sends it to the interconnected die; the interrupt interface of the MPU receives the interrupt event data packet and unpacks, and translates it into an interrupt signal.

8. The communication method of an interconnected die and an MPU according to claim 3, wherein the MPU controlling the data access between the slave devices through the DMA control interface comprises the following steps:

step 1: the MPU writes the configuration information of address information and data length of the data transmission into the exclusive address space of the DMA through the data interface;

step 2: after receiving the configuration information, the DMA control interface sends a read request event to the source slave device, and there is a specific event information flag in the read request event; the data returned from the slave device is returned to the destination slave device;

step 3: after receiving the read request event, the source slave device packs the data that needs to be read into a write data event and sends it to the destination slave device;

step 4: after receives the write data event, the destination slave device returns a write response event to the DMA control interface;

step 5: after receiving the write response event, the DMA control interface generates an interrupt pulse to inform the MPU that the data transmission is complete.

\* \* \* \* \*